US012567722B2

(12) United States Patent
    Wang et al.

(10) Patent No.:    US 12,567,722 B2
(45) Date of Patent:         Mar. 3, 2026

(54) LASER AUTOMATIC COMPENSATION CONTROL DEVICE, LASER PROCESSING SYSTEM AND LASER AUTOMATIC COMPENSATION CONTROL METHOD USING THE SAME

(71) Applicant: INDUSTRIAL TECHNOLOGY RESEARCH INSTITUTE, Hsinchu (TW)

(72) Inventors: Jia-You Wang, Kaohsiung City (TW); Fu-Shun Ho, Tainan City (TW); Chun-Chieh Yang, Kaohsiung City (TW); Chih-Chun Chen, Kaohsiung City (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 793 days.

(21) Appl. No.: 17/978,829

(22) Filed: Nov. 1, 2022

(65) Prior Publication Data

US 2024/0106197 A1      Mar. 28, 2024

(30) Foreign Application Priority Data

Sep. 28, 2022    (TW) ................................. 111136757

(51) Int. Cl.
    *H01S 5/0683*          (2006.01)
    *B23K 26/062*          (2014.01)
                    (Continued)

(52) U.S. Cl.
    CPC ........ *H01S 5/0683* (2013.01); *B23K 26/0626* (2013.01); *H01S 3/1305* (2013.01); *H01S 5/042* (2013.01); *H01S 5/4025* (2013.01)

(58) Field of Classification Search
    CPC ...... H01S 5/0683; H01S 3/1305; H01S 5/042; H01S 5/4025; H01S 5/0617; H01S 5/4012; B23K 26/0626
    See application file for complete search history.

(56) References Cited

U.S. PATENT DOCUMENTS 5,652,767 A  *  7/1997  Kiyonaga ............. H04L 25/069
                                                          375/360
5,963,570 A      10/1999  Gnauck et al.
                    (Continued)

FOREIGN PATENT DOCUMENTS

CN        102593702 A      7/2012
CN        109983637 A      7/2019
                    (Continued)

OTHER PUBLICATIONS

Taiwanese Notice of Allowance and Search Report for Taiwanese Application No. 111136757, dated Feb. 24, 2023.
                    (Continued)

*Primary Examiner* — Yuanda Zhang
(74) *Attorney, Agent, or Firm* — Birch, Stewart, Kolasch & Birch, LLP

(57)                    ABSTRACT

A laser automatic compensation control device includes a controller, a digital array, a decoder, a compensation array and a synchronizer. The controller is configured for receiving a number of laser energy signals and comparing each laser energy signal with a corresponding preset energy value to obtain a corresponding output digital signal. The digital array is electrically connected to the controller and configured for storing the output digital signals. The decoder is electrically connected to the digital array and configured for converting the output digital signals into a number of analog compensation signals. The compensation array is electrically connected to the decoder and configured for storing the analog compensation signals. The synchronizer is electri-
                    (Continued)

Laser automatic compensation control device 100 cally connected to the compensation array and configured for receiving the analog compensation signals, and synchronously outputting the analog compensation signals to a laser diode array.

13 Claims, 3 Drawing Sheets

(51) Int. Cl.
    *H01S 3/13*              (2006.01)
    *H01S 5/042*          (2006.01)
    *H01S 5/40*             (2006.01)

(56)            References Cited

U.S. PATENT DOCUMENTS

| | | |
|---|---|---|
| 7,166,826 B1 | 1/2007 | Kunst et al. |
| 9,616,679 B2 | 4/2017 | Childers |
| 2012/0044459 A1* | 2/2012 | Klein .................. H04N 13/363 |
| | | 353/30 |
| 2018/0294618 A1* | 10/2018 | Miyata ................. H01S 5/4012 |

FOREIGN PATENT DOCUMENTS

| | | |
|---|---|---|
| CN | 109991188 A | 7/2019 |
| TW | 373358 B | 11/1999 |
| TW | 200825366 A | 6/2008 |
| TW | 201001851 A | 1/2010 |
| TW | 201029007 A1 | 8/2010 |
| TW | 202046587 A | 12/2020 |

OTHER PUBLICATIONS

Chen et al., "Beam quality analysis and optimization for 10 kW-level spectral beam combination system", Optics Communications, vol. 444, 2019, pp. 45-55.
Huang, "The Multi-Functional Automatic Optical Power Control Driver Circuit Design for LASER Diode", Graduate Program of Optoelectronic Technology, College of Science and Technology, National Chi Nan University, 2013, 76 pages.

\* cited by examiner

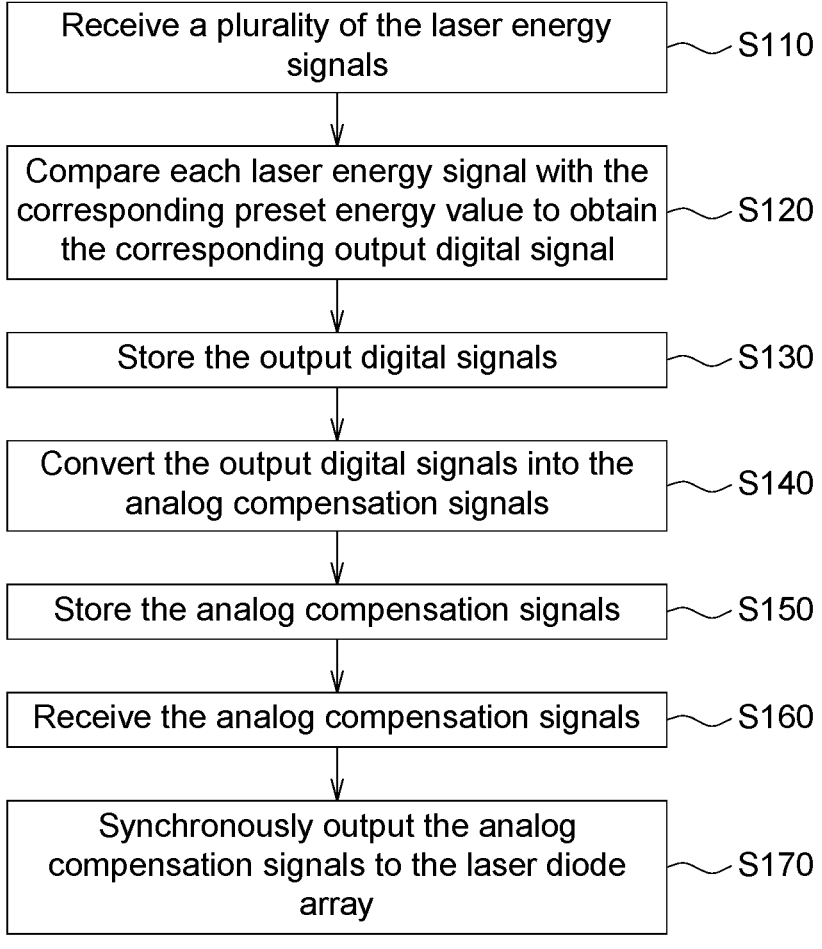

| Receive a plurality of the laser energy signals | S110 |

| Compare each laser energy signal with the corresponding preset energy value to obtain the corresponding output digital signal | S120 |

| Store the output digital signals | S130 |

| Convert the output digital signals into the analog compensation signals | S140 |

| Store the analog compensation signals | S150 |

| Receive the analog compensation signals | S160 |

| Synchronously output the analog compensation signals to the laser diode array | S170 |

FIG. 3

LASER AUTOMATIC COMPENSATION CONTROL DEVICE, LASER PROCESSING SYSTEM AND LASER AUTOMATIC COMPENSATION CONTROL METHOD USING THE SAME

This application claims the benefit of Taiwan application Serial No. 111136757, filed Sep. 28, 2022, the subject matter of which is incorporated herein by reference.

TECHNICAL FIELD

The present disclosure relates to a laser automatic compensation control device, a laser processing system and a laser automatic compensation control method using the same.

BACKGROUND

A conventional laser processing system includes a plurality of laser drivers and a plurality of laser diodes, and each laser driver may drive the laser diodes to emit laser beam to process a workpiece. However, the larger the output power of the laser beam emitted by the laser processing system, the larger the volume of the laser processing system. Therefore, how to improve the aforementioned conventional problems is one of the goals of those skilled in the art.

SUMMARY

According to an embodiment, a laser automatic compensation control device is provided. The laser automatic compensation control device includes a controller, a digital array, a decoder, a compensation array and a synchronizer. The controller is configured to receive a plurality of laser energy signals and compare each laser energy signal with a corresponding preset energy value to obtain a corresponding output digital signal. The digital array electrically is connected to the controller and configured to store the output digital signals. The decoder electrically is connected to the digital array and configured to convert the output digital signals into a plurality of analog compensation signals. The compensation array electrically is connected to the decoder and configured to store the analog compensation signals. The synchronizer is electrically connected to the compensation array and configured to receive the analog compensation signals, and synchronously output the analog compensation signals to a laser diode array.

According to another embodiment, a laser processing system is provided. The laser processing system includes a laser diode array and a laser automatic compensation control device. The laser automatic compensation control device is connected to the laser diode array and includes a controller, a digital array, a decoder, a compensation array and a synchronizer. The controller is configured to receive a plurality of laser energy signals and compare each laser energy signal with a corresponding preset energy value to obtain a corresponding output digital signal. The digital array electrically is connected to the controller and configured to store the output digital signals. The decoder electrically is connected to the digital array and configured to convert the output digital signals into a plurality of analog compensation signals. The compensation array electrically is connected to the decoder and configured to store the analog compensation signals. The synchronizer is electrically connected to the compensation array and configured to receive the analog compensation signals, and synchronously output the analog compensation signals to the laser diode array.

According to another embodiment, a laser automatic compensation control method is provided. The laser automatic compensation control method includes the following steps: receiving a plurality of laser energy signals; comparing each laser energy signal with corresponding a preset energy value to obtain a corresponding output digital signal; storing the output digital signals; converting the output digital signals into a plurality of analog compensation signals; storing the analog compensation signals; receiving the analog compensation signals; and synchronously outputting the analog compensation signals to a laser diode array.

The above and other aspects of the disclosure will become better understood with regard to the following detailed description of the preferred but non-limiting embodiment (s). The following description is made with reference to the accompanying drawings.

BRIEF DESCRIPTION OF THE DRAWINGS

FIG. 3 shows a flowchart of an automatic laser compensation control method of the laser automatic compensation control device of FIG. 1.

Figure 1:
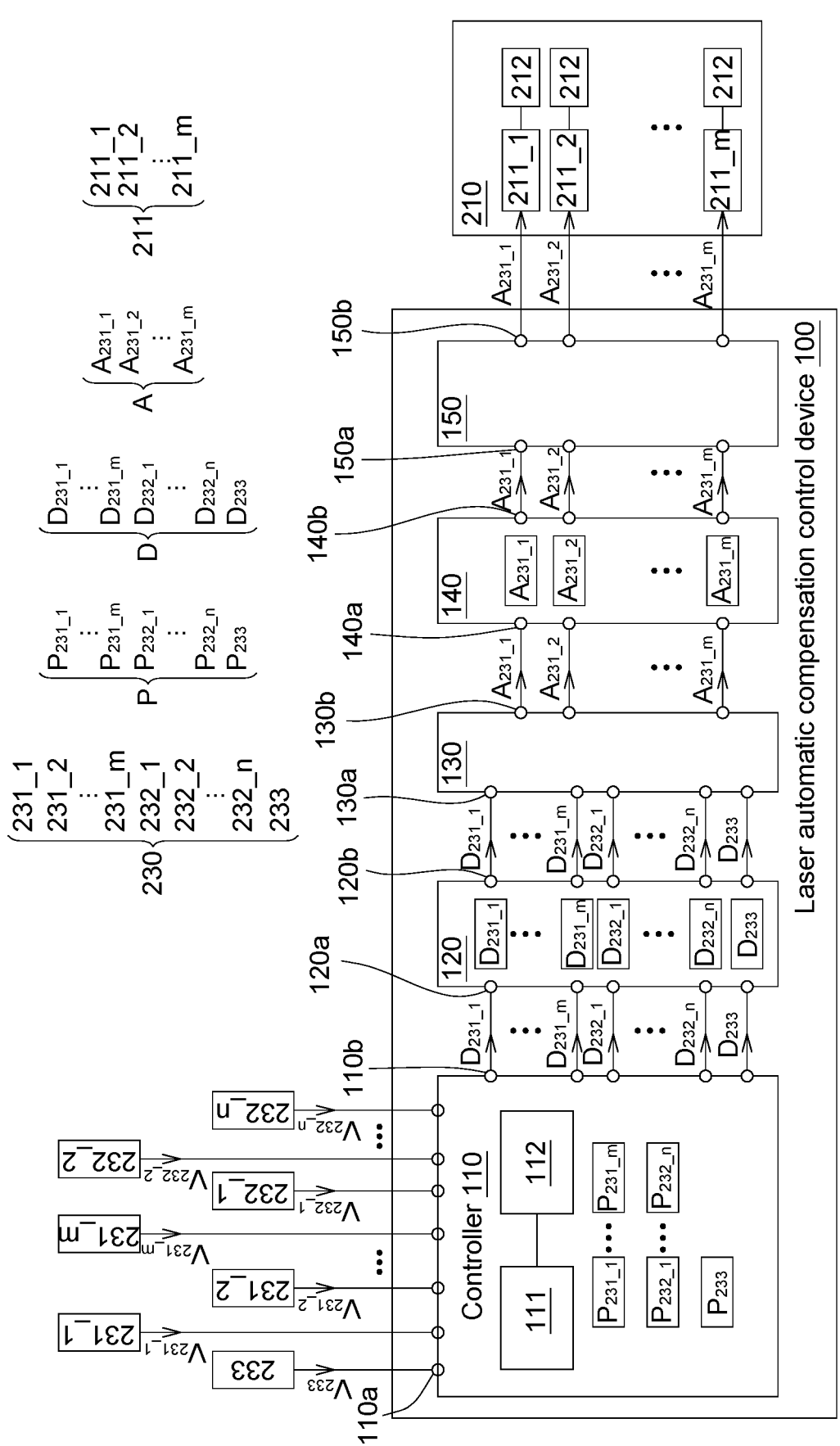
FIG. 1 shows a functional block diagram of a laser automatic compensation control device 100 according to an embodiment of the present disclosure.

In the following detailed description, for purposes of explanation, numerous specific details are set forth in order to provide a thorough understanding of the disclosed embodiments. It will be apparent, however, that one or more embodiments could be practiced without these specific details. In other instances, well-known structures and devices are schematically shown in order to simplify the drawing.

DETAILED DESCRIPTION OF PREFERRED EMBODIMENTS

Referring to FIG. 1, FIG. 1 shows a functional block diagram of a laser automatic compensation control device 100 according to an embodiment of the present disclosure. The laser automatic compensation control device 100 includes a controller 110, a digital array 120, a decoder 130, a compensation array 140 and a synchronizer 150. The controller 110 is configured for receiving a plurality of laser energy signals V and comparing each laser energy signal with a corresponding preset energy value P, so as to obtain an output digital signal D corresponding to each laser energy signal V. The digital array 120 is electrically connected to the controller 110 and configured to store the output digital signals D. The decoder 130 is electrically connected to the digital array 120 and is configured for converting the output digital signals D into a plurality of analog compensation signals A. The compensation array 140 is electrically connected to the decoder 130 and configured for storing the analog compensation signals A. The synchronizer 150 is electrically connected to the compensation array 140 for receiving the analog compensation signals A and synchronously outputting the analog compensation signals A to a laser diode array 210.

In the present embodiment, a plurality of laser energy signals V correspond to one controller 110 (namely, manyto-one). Compared with one feedback laser energy signals V corresponding to one controller, in the disclosed embodiment, one controller 110 may once or simultaneously receive/process a plurality of the laser energy signals V, and it may accordingly reduce the number of used components and effectively reduce the volume of a laser processing system.

As shown in FIG. 1, the controller 110, the digital array 120, the decoder 130, the compensation array 140 and/or the synchronizer 150 are, for example, physical circuits formed by using at least one semiconductor process. At least two of the controller 110, the digital array 120, the decoder 130, the compensation array 140 and the synchronizer 150 may be integrated into a single unit. Alternatively, at least one of the digital array 120, the decoder 130, the compensation array 140 and the synchronizer 150 may be integrated into the controller 110.

The preset energy value P and the laser energy signal V are equal in number. For example, the number of the preset energy value P and the number of the laser energy signal V both are q, wherein q is, for example, a positive integer equal to or greater than 2. Each preset energy value P represents an initial preset value of a photoelectric sensor 230.

As shown in FIG. 1, the photoelectric sensor 230 includes a photoelectric sensor 231_1, a photoelectric sensor 231_2, . . . , a photoelectric sensor 231_m, a photoelectric sensor 232_1, a photoelectric sensor 232_1, . . . , a photoelectric sensor 232_n and a photoelectric sensor 233. The preset energy value $P_{231\_1}$ represents an initial preset value of the photoelectric sensor 231_1, the preset energy value $P_{231\_2}$ represents an initial preset value of the photoelectric sensor 231_1, . . . , the preset energy value $P_{231\_m}$ represents an initial preset value of a photoelectric sensor 231_m, the preset energy value $P_{232\_1}$ represents an initial preset value of the photoelectric sensor 232_1, the preset energy value $P_{232\_2}$ represents an initial preset value of the photoelectric sensor 232_2, . . . , the preset energy value $P_{232\_n}$ represents an initial preset value of the photoelectric sensor 232_n, and the preset energy value $P_{233}$ represents an initial preset value of the photoelectric sensor 233. In the present embodiment, q is equal to, for example, n+m+1, wherein n and m each is a positive integer, for example, greater than or equal to 1.

Depending on the system settings, the values of any two preset energy values P may be equal or different. When the difference between the laser energy signal V detected by one photoelectric sensor and the corresponding preset energy value P is within an allowable range, it means that the photoelectric sensor operates normally. On the contrary, when the difference between the laser energy signal V detected by one photoelectric sensor and the corresponding preset energy value P is outside the allowable range, it means that the photoelectric sensor operates abnormally. In addition, the preset energy value P may be pre-stored in the controller 110. In an embodiment, the preset energy value P is a set value after corrected or calibrated by the laser automatic compensation control device 100, and the preset energy value P is a fixed value, for example.

The laser energy signals V and the photoelectric sensors 230 are equal in number. For example, the number of the laser energy signal V and the number of the photoelectric sensor 230 both are q. As shown in FIG. 1, the laser energy signal V is detected by the photoelectric sensor 230. For example, the laser energy signal $V_{231\_1}$ is detected by the photoelectric sensor 231_1, the laser energy signal $V_{231\_2}$ is detected by the photoelectric sensor 231_2, . . . , the laser energy signal $V_{231\_m}$ is detected by the photoelectric sensor 231_m, the laser energy signal $V_{232\_1}$ is detected by the photoelectric sensor 232_1, the laser energy signal $V_{232\_2}$ is detected by the photoelectric sensor 232_2, . . . , the laser energy signal $V_{232\_n}$ is detected by the photoelectric sensor 232_n and the energy signal $V_{233}$ is detected by the photoelectric sensor 233.

As shown in FIG. 1, the controller 110 includes q control-end input ports 110a, q control-end output ports 110b, a comparison unit 111 and an analysis unit 112. The control-end input ports 110a receive the laser energy signals V respectively. The connection relationship between the laser energy signals V and the control-end input ports 110a is fixed, and the connection relationship between the preset energy values P and the control-end input ports 110a is also fixed. As a result, the corresponding relationship between the laser energy signals V and the preset energy values P is fixed. For example, the laser energy signal $V_{231\_1}$ and the preset energy value $P_{231\_1}$ correspond to the same control-end input port 110a, the laser energy signal $V_{231\_2}$ and the preset energy value $P_{231\_2}$ correspond to the same control-end input port 110a, . . . , the laser The energy signal $V_{232\_1}$ and the preset energy value $P_{232\_1}$ correspond to the same control-end input port 110a, the laser energy signal $V_{232\_2}$ and the preset energy value $P_{232\_2}$ correspond to the same control-end input port 110a, . . . , the laser energy signal $V_{232\_n}$ and the preset energy value $P_{232\_n}$ corresponds to the same control-end input port 110a, and the laser energy signal $V_{233}$ and the preset energy value $P_{233}$ correspond to the same control-end input port 110a.

As shown in FIG. 1, when the controller 110 receives the laser energy signal V from one control-end input port 110a, the comparison unit 111 may correctly obtain the preset energy value P corresponding the said control-end input port 110a according to the aforementioned corresponding relationship, and compare the preset energy value P with the laser energy signal V (also called "channel comparison") to obtain a difference (For example, a difference value) between the preset energy value P and the laser energy signal V. Taking the laser energy signal $V_{231\_1}$ as an example, when the controller 110 receives the laser energy signal $V_{231\_1}$ from the control-end input port 110a, the comparison unit 111 may compare the laser energy signal $V_{231\_1}$ with the preset energy value $P_{231\_1}$ corresponding to the corresponding control-end input port 110a and accordingly obtain the difference between the laser energy signal $V_{231\_1}$ and the preset energy value $P_{231\_1}$.

By using the aforementioned principles, the comparison unit 111 may obtain the difference between the preset energy value $P_{231\_2}$ and the laser energy signal $V_{231\_2}$, . . . , the difference between the preset energy value $P_{231\_m}$ and the laser energy signal $V_{231\_m}$, the difference between the preset energy value $P_{232\_1}$ and the laser energy signal $V_{232\_1}$, the difference between the preset energy value $P_{232\_2}$ and the laser energy signal $V_{232\_2}$, . . . , the difference between the preset energy value $P_{232\_n}$ and the laser energy signal $V_{232\_n}$, and the difference between the preset energy value $P_{233}$ and the laser energy signal $V_{233}$.

As shown in FIG. 1, the analysis unit 112 may analyze the difference between each laser energy signal V and the corresponding preset energy value P, and accordingly determine the corresponding output digital signal D. For example, the analyzing unit 112 may analyze the difference between the laser energy signal $V_{231\_1}$ and the corresponding preset energy value $P_{231\_1}$, and accordingly determines the corresponding output digital signal $D_{231\_1}$. By using the aforementioned principles, the analysis unit 112 may determine the corresponding output digital signals $D_{231\_2}$, . . . , $D_{231\_m}$, $D_{232\_1}$, $D_{232\_2}$, . . . $D_{232\_n}$ and $D_{233}$.

The number of the output digital signals D is, for example, q. After at least m output digital signals D among the q output digital signals D are subsequently converted into m analog compensation signals, the m analog compensation signals may be configured to drive m laser drivers 211 of the laser diode array 210. For example, after the m output digital signals $D_{231\_1}$, $D_{231\_2}$, . . . , $D_{231\_m}$ are subsequently converted into m analog compensation signals $A_{231\_1}$, $A_{231\_2}$, . . . , $A_{231\_m}$, the m analog compensation signals $A_{231\_1}, A_{231\_2}, . . . , A_{231\_m}$ may be configured to drive the m laser drivers 211\_1, 211\_2, . . . , 211\_m of the laser diode array 210. It can be understood that one laser automatic compensation control device 100 according to the embodiment of the present disclosure corresponds to a plurality of the laser drivers 211 (one-to-many), and accordingly it may once or simultaneously drive the plurality of the laser drivers 211. Compared with one controller corresponding to one laser driver, one laser automatic compensation control device 100 according to the embodiment of the present disclosure once or simultaneously drive the plurality of the laser drivers 211, and accordingly it may reduce the number of components used and effectively reduce the volume of the laser processing system.

The number m of the laser drivers 211 may depend on the output power of the laser; however, such exemplification is not meant to be for limiting.

As shown in FIG. 1, the controller 110 further includes q control-end output ports 110*b*, and the digital array 120 includes at least q digital-array-end input ports 120*a*. The control-end output ports 110*b* and the digital-array-end input ports 120*a* are electrically connected to each other correspondingly. That is, the connection relationship between the control-end output ports 110*b* and the digital-array-end input ports 120*a* is fixed. As a result, each output digital signal D may be transmitted to the corresponding digital-array-end input port 120*a* of the digital array 120 through the corresponding control-end output port 110*b*. The digital array 120 is, for example, a storage unit (for example, a memory), which may store the received output digital signal D.

As shown in FIG. 1, the digital array 120 further includes m digital-array-end output ports 120*b*, and the decoder 130 includes m decoder-end input ports 130*a*. The digital-array-end output ports 120*b* and the decoder-end input ports 130*a* are electrically connected to each other correspondingly. That is, the connection relationship between the digital-array-end output ports 120*b* and the decoder-end input ports 130*a* is fixed. As a result, each output digital signal D may be transmitted to the corresponding decoder-end input ports 130*a* through the digital-array-end output ports 120*b*. The decoder 130 is, for example, a digital-to-analog converter. The decoder 130 may convert the received output digital signal D into a signal capable of controlling the laser driver, such as the analog compensation signal. For example, the decoder 130 converts the output digital signal $D_{231\_1}$ into the analog compensation signal $A_{231\_1}$, converts the output digital signal $D_{231\_2}$ into the analog compensation signal $A_{231\_2}$, . . . , and converts the output digital signal $D_{231\_m}$ into the analog compensation signal $A_{231\_m}$. The analog compensation signals A and the laser drivers 211 are equal in number, for example, m.

As shown in FIG. 1, the decoder 130 further includes m decoder-end output ports 130*b*, and the compensation array 140 includes m compensation-array-end input ports 140*a*. The decoder-end output ports 130*b* and the compensation-array-end input ports 140*a* are electrically connected to each other correspondingly. That is, the connection relationship between the decoder-end output ports 130*b* and the compensation-array-end input ports 140*a* is fixed. As a result, each analog compensation signal A may be transmitted to the compensation-array-end input ports 140*a* through the corresponding decoder-end output ports 130*b*.

As shown in FIG. 1, the compensation array 140 further includes m compensation-array-end output ports 140*b*, and the synchronizer 150 includes m synchronizer-end input ports 150*a*. The compensation-array-end output ports 140*b* and the synchronizer-end input ports 150*a* are electrically connected to each other correspondingly. That is, the connection relationship between the compensation-array-end output ports 140*b* and the synchronizer-end input ports 150*a* is fixed. As a result, each analog compensation signal A may be transmitted to the corresponding synchronizer-end input ports 150*a* through the corresponding compensation-array-end output ports 140*b*. The compensation array 140 is, for example, a storage unit (for example, a memory), which may store the received analog compensation signal A.

As shown in FIG. 1, the synchronizer 150 includes m synchronizer-end output ports 150*b*, and each analog compensation signal A may be transmitted to the corresponding laser driver 211 through the corresponding synchronizer-end output ports 150*b*. The synchronizer 150 may periodically turn on all synchronizer-end output ports 150*b* to synchronously output all analog compensation signals A to the laser drivers 211.

Figure 2:
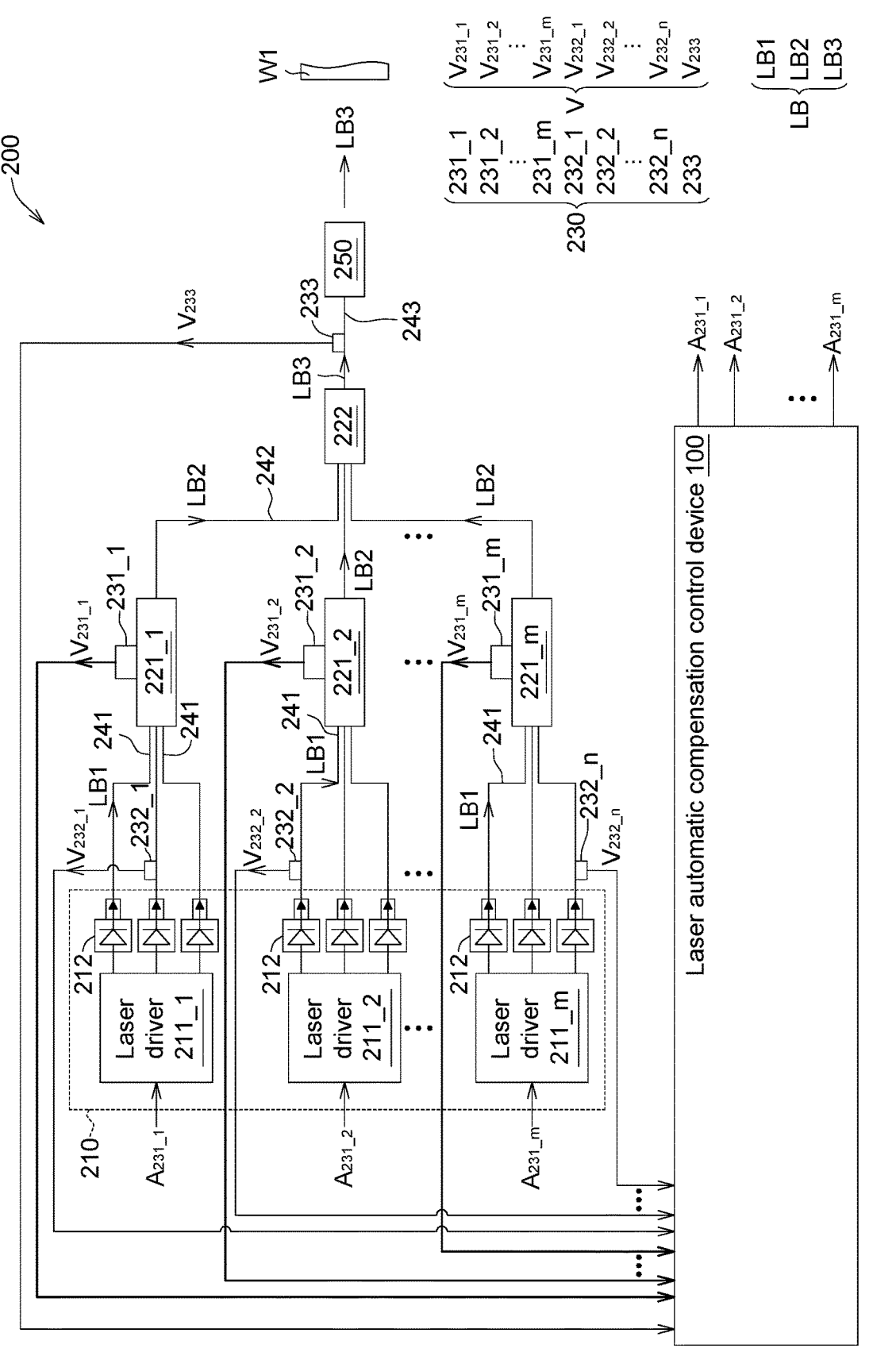
FIG. 2 shows a functional block diagram of a laser processing system according to an embodiment of the present disclosure.

Referring to FIG. 2, FIG. 2 shows a functional block diagram of a laser processing system 200 according to an embodiment of the present disclosure. The laser processing system 200 includes the laser automatic compensation control device 100, a laser diode array 210, a plurality of power combiners 220, q photoelectric sensors 230, a plurality of optical fibers 241 to 243 and a transmitter 250.

As shown in FIG. 2, the laser diode array 210 is connected to the laser automatic compensation control device 100. The laser diode array 210 may provide a plurality of laser beams LB. The power combiner 220 may combine the laser beams LB. The photodetectors 230 are disposed adjacent to the laser beams LB and configured to detect the laser beams LB to obtain the laser energy signals V.

As shown in FIG. 2, the laser diode array 210 includes m laser drivers 211 and a plurality of laser diodes 212. The laser drivers 211 include, for example, a laser driver 211\_1, a laser driver 211\_2, . . . , a laser driver 211\_m. Each laser driver 211 may drive at least one laser diode 212 to emit a laser beam LB1. In the present embodiment, one laser driver 211 may drive three laser diodes 212 to emit the laser beam LB1; however, such exemplification is not meant to be for limiting.

As shown in FIG. 2, the laser diodes 212 may be connected to the power combiners 220. For example, the power combiners 220 include a plurality of power combiners 221\_1, 221\_2, . . . , 221\_m and 222. At least two laser diodes 212 may be connected to one of the power combiners 221\_1, 221\_2, . . . , 211\_m, so that the laser beams LB1 of the laser diodes 212 may be transferred to the power combiners 221\_1, 221\_2, . . . , 211\_m through the optical fibers 241 to be combine into a laser beam LB2. Each of the m power combiners 221\_1, 221\_2, . . . , 221\_m may be connected to the power combiner 222 through the optical fiber 242 to combine a plurality of the laser beams LB2 into a laser beam LB3. The power combiner 222 may be connected to the transmitter 250 through the optical fiber 243, and the transmitter 250 may emit the laser beam LB3 to process a workpiece W1.

As shown in FIG. 2, the q laser energy signals V come from the q photoelectric sensors 230 of the laser diode array 210, and the laser energy signals V and the photoelectric sensors 230 are equal in number, wherein p is, for example, a positive integer greater than or equal to 2. In the present embodiment, q is equal to, for example, n+m+1, wherein n and m each is a positive integer, for example, greater than or equal to 1. The n photoelectric sensors 232_1, 232_2, . . . , 232_n may detect a plurality of the laser beams LB1 emitted by the n laser diodes 212 respectively, m photoelectric sensors 231_1, 231_2, . . . , 231_m may detect a plurality of the combined laser beams LB2 within the m power combiners 221_1, 221_2, . . . , 221_m, and the photoelectric sensor 233 may detect the total combined laser beam LB3.

As shown in FIG. 2, each photoelectric sensor 230 may be disposed in different detection positions of the laser optical path, and the aforementioned preset energy value P is the detection energy value detected by the corresponding photoelectric sensor 230 at a position in a preset state (for example, a normal state). The photoelectric sensor 231_1 is disposed on the power combiner 221_1 to detect the laser energy signal $V_{231\_1}$ of the laser beam LB2 in the power combiner 221_1. For another example, the photoelectric sensor 232_1 is disposed on one of the optical fibers 241 to detect the laser energy signal $V_{232\_1}$ of the laser beam LB1 emitted by the laser diode 212. For another example, the photoelectric sensor 233 is disposed on the optical fiber 243 between the power combiner 222 and the transmitter 250 to detect the laser energy signal $V_{233}$ of the laser beam LB3.

As shown in FIG. 2, the laser automatic compensation control device 100 may periodically turn on all synchronizer-end output ports 150b to synchronously output all analog compensation signals A to all the laser drivers 211. For example, the laser automatic compensation control device 100 may synchronously output the analog compensation signal $A_{231\_1}$, the analog compensation signal $A_{231\_2}$, . . . , the analog compensation signal $A_{231\_m}$ to the laser driver 211_1, the laser driver 211_2, . . . , and the laser driver 211_m respectively.

Referring to FIG. 3, FIG. 3 shows a flowchart of an automatic laser compensation control method of the laser automatic compensation control device 100 of FIG. 1. Before emitting the laser beam for the machining process, the parameters of the laser processing system 200 may be set according to a desired machining goal, then the laser processing system 200 emits the laser beam to process the workpiece W1, and synchronously executes the laser automatic compensation control process shown in FIG. 3.

In step S110, the controller 110 may receive q laser energy signals V, such as laser energy signals $V_{231\_1}$, $V_{231\_2}$, . . . , $V_{231\_m}$, $V_{232\_1}$, $V_{232\_2}$, . . . , $V_{232\_n}$ and $V_{233}$.

In step S120, the controller 110 may compare each laser energy signal V with the corresponding preset energy value P to obtain the corresponding output digital signal D, such as the output digital signal $D_{231\_1}$, $D_{231\_2}$, $D_{231\_m}$, . . . , $D_{232\_1}$, $D_{232\_2}$, . . . , $D_{232\_n}$, and $D_{233}$.

In step S130, the digital array 120 may store q output digital signals D, such as the output digital signals $D_{231\_1}$, $D_{231\_2}$, . . . $D_{231\_m}$, $D_{232\_1}$, $D_{232\_2}$, . . . , $D_{232\_n}$, and $D_{233}$.

In step S140, the decoder 130 may convert m output digital signals D among the q output digital signals D into m analog compensation signals A. For example, the decoder 130 converts the output digital signals $D_{231\_1}$, $D_{231\_2}$, . . . , $D_{231\_m}$ into the analog compensation signals $A_{231\_1}$, $A_{231\_2}$, . . . , $A_{231\_m}$ respectively.

In step S150, the compensation array 140 may store m analog compensation signals A, such as the analog compensation signals $A_{231\_1}$, $A_{231\_2}$, . . . $A_{231\_m}$.

In step S160, the synchronizer 150 may receive the analog compensation signals A, such as the analog compensation signals $A_{231\_1}$, $A_{231\_2}$, . . . $A_{231\_m}$.

In step S170, the synchronizer 150 may synchronously output the analog compensation signals A to the laser diode array 210.

The laser driver 211 of the laser diode array 210 controls the laser diode 212 to emit the laser beam LB1 according to the analog compensation signal A, so that the output power of a target laser beam of the laser diode 212 at a position of a downstream of the laser optical path conforms to a set value, wherein the aforementioned target laser beam is, for example, the laser beam LB1, the laser beam LB2 and/or the laser beam LB3.

During the processing of the laser processing system 200, the laser automatic compensation control device 100 determines whether the laser energy signal detected by each photoelectric sensor 230 is deviated from the preset energy value P according to the feedback q laser energy signals V. If the laser energy signal V deviates from the preset energy value P, the controller 110 obtains or determines a plurality of the output digital signals D according to at least one of all the laser energy signals V, and after the output digital signals D are converted into m analog compensation signals A, the m analog compensation signals A may synchronously transmitted to the m laser drivers 211 of the laser diode array 210. The m laser drivers 211 accordingly drive the laser diodes 212 to emit adjusted laser beams, so that the workpiece W1 processed by the laser processing system 200 meets the desired machining goal.

It will be apparent to those skilled in the art that various modifications and variations could be made to the disclosed embodiments. It is intended that the specification and examples be considered as exemplary only, with a true scope of the disclosure being indicated by the following claims and their equivalents.

What is claimed is:

1. A laser automatic compensation control device, comprising:
a controller configured to:
receive a plurality of laser energy signals; and
compare each laser energy signal with a corresponding preset energy value to obtain a corresponding output digital signal;
a digital array electrically connected to the controller and configured to store the output digital signals;
a decoder electrically connected to the digital array and configured to convert the output digital signals into a plurality of analog compensation signals;
a compensation array electrically connected to the decoder and configured to store the analog compensation signals; and
a synchronizer electrically connected to the compensation array and configured to:
receive the analog compensation signals; and
synchronously output the analog compensation signals to a laser diode array.

2. The laser automatic compensation control device according to claim 1, wherein a plurality of the preset energy values is stored in the controller.

3. A laser processing system, comprising:

a laser diode array; and a laser automatic compensation control device connected to the laser diode array and comprising:

a controller configured to:

receive a plurality of laser energy signals; and compare each laser energy signal with a corresponding preset energy value to obtain a corresponding output digital signal;

a digital array electrically connected to the controller and configured to store the output digital signals;

a decoder electrically connected to the digital array and configured to convert the output digital signals into a plurality of analog compensation signals;

a compensation array electrically connected to the decoder and configured to store the analog compensation signals; and a synchronizer electrically connected to the compensation array and configured to:

receive the analog compensation signals; and synchronously output the analog compensation signals to the laser diode array.

4. The laser processing system according to claim 3, wherein the laser diode array is configured to provide a plurality of laser beams; the laser processing system further comprises:

a plurality of power combiners configured to combine the laser beams; and a plurality of photoelectric sensors disposed adjacent to the laser beams and configured to detect the laser beams to obtain the laser energy signals.

5. The laser processing system according to claim 4, wherein the photoelectric sensors and the laser energy signals are equal in number.

6. The laser processing system according to claim 4, wherein each of the photoelectric sensors is disposed at a detection position, and the preset energy value is a detection energy value detected by the corresponding photoelectric sensor at the detection position in a preset state.

7. The laser processing system according to claim 3, wherein a plurality of the preset energy values is stored in the controller.

8. The laser processing system according to claim 3, wherein the laser diode array comprises:

a plurality of laser diodes; and a plurality of laser drivers each electrically connected to the corresponding laser diode;

wherein the synchronizer is configured to output each analog compensation signal to the corresponding laser driver.

9. The laser processing system according to claim 8, wherein the laser drivers and the analog compensation signals are equal in number.

10. A laser automatic compensation control method, comprises:

receiving a plurality of laser energy signals;

comparing each laser energy signal with corresponding a preset energy value to obtain a corresponding output digital signal;

storing the output digital signals;

converting the output digital signals into a plurality of analog compensation signals;

storing the analog compensation signals;

receiving the analog compensation signals; and synchronously outputting the analog compensation signals to a laser diode array.

11. The laser automatic compensation control method according to claim 10, wherein the laser energy signals and the plurality of photoelectric sensors are equal in number.

12. The laser automatic compensation control method according to claim 10, wherein a plurality of the preset energy values is stored in a controller.

13. The laser automatic compensation control method according to claim 10, wherein the laser diode array comprises a plurality of laser drivers, and the laser drivers and the analog compensation signals are equal in number.

* * * * *